(12) United States Patent
Kim

(10) Patent No.: US 7,230,291 B2
(45) Date of Patent: Jun. 12, 2007

(54) FERROELECTRIC CAPACITORS HAVING OXIDATION BARRIER CONDUCTIVE LAYERS AND LOWER ELECTRODES DISPOSED IN TRENCHES DEFINED BY SUPPORTING INSULATING LAYERS

(75) Inventor: Hyun-Ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/650,879

(22) Filed: Aug. 28, 2003

(65) Prior Publication Data

US 2004/0046196 A1    Mar. 11, 2004

(30) Foreign Application Priority Data

Sep. 11, 2002    (KR)    ............ 10-2002-0054908

(51) Int. Cl.
*H01L 29/76* (2006.01)
*H01L 27/108* (2006.01)

(52) U.S. Cl. .................... 257/295; 257/310
(58) Field of Classification Search ................ 257/303, 257/306, 310, 295, 296, 532, 774; 438/3
See application file for complete search history.

(56) References Cited

U.S. PATENT DOCUMENTS

| | | | |
|---|---|---|---|
| 6,521,927 B2 * | 2/2003 | Hidaka et al. | 257/295 |
| 6,593,638 B1 * | 7/2003 | Summerfelt et al. | 257/532 |
| 6,764,862 B2 * | 7/2004 | Park et al. | 438/3 |

FOREIGN PATENT DOCUMENTS

| | | |
|---|---|---|
| JP | 10-107223 | 4/1998 |
| JP | 10-335581 | 12/1998 |
| KR | 1999-0039831 | 6/1999 |
| KR | 2002-0035792 | 5/2002 |

OTHER PUBLICATIONS

Korean Patent Office, Notice to File a Response/Amendment to the Examination Report, Aug. 26, 2004.
Korean Patent Office, Notice to File a Response/Amendment to the Examination Report, Aug. 26, 2004 (English Translation).
Korean Patent Office, Notice to File a Response To a Rejection, corresponding to Korean Patent application 2002-54908, received Mar. 15, 2005.
Korean Patent Office, Notice to File a Response To a Rejection, corresponding to Korean Patent application 2002-54908, received Mar. 15, 2005 (English Translation).

* cited by examiner

*Primary Examiner*—Howard Weiss
*Assistant Examiner*—(Vikki) Hoa B. Trinh
(74) *Attorney, Agent, or Firm*—Myers Bigel Sibley & Sajovec

(57) ABSTRACT

Ferroelectric capacitors are provided that include an integrated circuit substrate and a supporting insulation layer on the integrated circuit substrate having a face and a trench in the face. An oxidation barrier conductive layer is provided in the trench and a lower electrode is provided on the oxidation barrier conductive layer. A ferroelectric layer is provided on the lower electrode and an upper electrode is provided on the ferroelectric layer. Related methods of fabricating ferroelectric capacitors are also provided.

12 Claims, 19 Drawing Sheets

US 7,230,291 B2

FERROELECTRIC CAPACITORS HAVING OXIDATION BARRIER CONDUCTIVE LAYERS AND LOWER ELECTRODES DISPOSED IN TRENCHES DEFINED BY SUPPORTING INSULATING LAYERS

RELATED APPLICATION

This application is related to and claims priority from Korean Application No. 2002-54908, filed Sep. 11, 2002, the disclosure of which is hereby incorporated herein by reference as if set forth in its entirety.

FIELD OF THE INVENTION

The present invention relates to integrated circuit devices and methods of fabricating the same, and, more particularly, to ferroelectric capacitors and methods of fabricating the same.

BACKGROUND OF THE INVENTION

Ferroelectric capacitors are used in integrated circuit memory devices has become more frequent due to their operation speed, low-power and low-voltage operation, good tolerance and the like. Ferroelectric memory devices can store data when power to the integrated circuit memory device is cut off, i.e. ferroelectric memory devices can be used as non-volatile memory devices. A ferroelectric material provided between electrodes of the ferroelectric memory device may provide the non-volatile properties. The ferroelectric material typically has two polarization states. The polarization state of the ferroelectric material may be changed by applying an electric field and may be retained after the electrical field is no longer applied, i.e. the ferroelectric memory device may store data when the power to the device is cut off.

Similar to the structure of conventional dynamic random access memories (DRAMs) capacitor, ferroelectric capacitors typically include a ferroelectric material between two electrodes. DRAM capacitors store data using a dielectric layer between two electrodes. In contrast, ferroelectric capacitors utilize the polarization property of a ferroelectric material between the two electrodes to store data. Thus, ferroelectric capacitors may be formed using methods of fabrication different from the methods of fabrication used for DRAMs because the ferroelectric capacitor utilizes a new material, i.e., the ferroelectric material, not used in the fabrication process of DRAMs. For example, if polysilicon is used as a material for one of the electrodes of the ferroelectric capacitor, the ferroelectric material may react with the polysilicon. Accordingly, a noble material such as platinum and/or a conductive material such as ruthenium dioxide may be used for the electrodes of ferroelectric capacitors so that a reaction may not occur.

Furthermore, after forming the ferroelectric material, the ferroelectric material may be treated using a thermal process having a high temperature in an oxygen ambient to provide a ferroelectric crystalline structure, i.e., a perovskite structure. During the thermal process, a thin insulation layer, for example, silicon dioxide, may be formed at an interface between a polysilicon contact plug and a lower electrode, which may cause the contact resistance to be degraded. Thus, an oxidation barrier conductive layer may be formed between the contact plug and the lower electrode in conventional devices to reduce the degradation of the contact resistance.

Referring now to FIGS. 1A and 1B, cross-sections of conventional ferroelectric capacitors will be discussed. As illustrated in FIG. 1A, an insulation layer 10 is formed on an integrated circuit substrate (not shown). A polysilicon contact plug 12 is provided in the insulation layer 10 so as to electrically connect an active region of the integrated circuit substrate (not shown) to an oxidation barrier conductive layer 14. The oxidation barrier conductive layer 14 is provided on the insulation layer 10 and the contact plug 12. A lower electrode layer 16 is provided on the oxidation barrier conductive layer 14. A ferroelectric layer 18 is provided on the lower electrode and an upper electrode layer 20 is provided on the ferroelectric layer 18.

Referring now to FIG. 1B, the oxidation barrier conductive layer 14, the lower electrode layer 16, the ferroelectric layer 18 and the upper electrode layer 20 are etched to form a capacitor 22. As illustrated in FIG. 1B, the ferroelectric capacitor 22 may have an inclined sidewall profile, which may be caused by electrode layers that are not typically easily etched and/or thick material layers. Accordingly, the ferroelectric capacitor 22 may be unintentionally electrically connected to an adjacent ferroelectric capacitor. This potential problem may be addressed by increasing a distance between adjacent cells, however, this may reduce the number of cells that may be integrated on a single chip. Furthermore, inclined sidewalls of the ferroelectric layer 18 may decrease an area directly contacting the upper electrode, thereby reducing the contact resistance of the device.

Furthermore, to decrease the likelihood of having inclined sidewalls as illustrated in FIG. 1B, the thicknesses of the oxidation barrier conductive layer 14, the lower electrode layer 16, the ferroelectric layer 18 and/or the upper electrode layer 20 may be decreased. However, decreasing the thickness of the oxidation barrier conductive layer 14 may cause a surface of the contact plug 12 to be unintentionally oxidized, thus, possibly increasing the contact resistance of the device. Furthermore, decreasing the thickness of the lower electrode layer 16 may make it difficult to provide a ferroelectric material having an acceptable crystalline property because the crystalline property of the ferroelectric material may depend on the lower electrode layer 16. In addition, when the oxidation barrier conductive layer 14, the lower electrode layer 16, the ferroelectric layer 18 and the upper electrode layer 20 are etched to form the capacitor 22, the ferroelectric layer 18 may be over etched by the etchant such that the properties of the ferroelectric material may be degraded. Furthermore, after the ferroelectric layer 18 is etched, the ferroelectric layer 18 may be exposed to an etching ambient, for example, a plasma gas, which may also damage the ferroelectric material. It will be understood that the damage caused during the etch may occur even if the layers 20, 18, 16, 14 are etched in separate steps. Accordingly, improved ferroelectric capacitors and methods of fabricating ferroelectric capacitors may be desired.

SUMMARY OF THE INVENTION

Embodiments of the present invention provide ferroelectric capacitors including an integrated circuit substrate and a supporting insulation layer on the integrated circuit substrate having a face and a trench in the face. An oxidation barrier conductive layer is provided in the trench and a lower electrode is provided on the oxidation barrier conductive layer. A ferroelectric layer is provided on the lower electrode and an upper electrode is provided on the ferroelectric layer.

In some embodiments of the present invention, the trench may include a lower portion adjacent the integrated circuit substrate and an upper portion remote from the integrated circuit substrate. The oxidation barrier conductive layer may be provided in the lower portion of the trench and the lower electrode may be provided in the upper portion of the trench.

In further embodiments of the present invention, the capacitor may further include an insulation layer on the integrated circuit substrate. The insulation layer may define a contact hole exposing at least a portion of an active region of the integrated circuit substrate. A contact plug may be provided in the contact hole and the supporting insulation layer may be on the insulation layer. The trench may expose a surface of the contact plug and at least a portion of the insulation layer. The ferroelectric layer may be on the supporting insulation layer and the lower electrode.

In still further embodiments of the present invention, the capacitor may further include an adhesion conductive layer between the oxidation barrier conductive layer and a surface of the conductive plug, a surface of the insulating layer and sidewalls of supporting insulation layer.

In some embodiments of the present invention, the contact hole may include an upper portion remote from the integrated circuit substrate and a lower portion adjacent the integrated circuit substrate. The contact plug may be provided in the lower portion of the contact hole and the oxidation barrier conductive layer may extend into the upper portion of the contact hole on the contact plug. An adhesion conductive layer may be provided between the oxidation barrier conductive layer and a surface of the conductive plug, sidewalls of the contact hole, a surface of the insulating layer and sidewalls of supporting insulation layer.

In further embodiments of the present invention, the supporting insulation layer may include a first supporting insulation layer and the trench in the face of the supporting insulting layer may include a first trench. In these embodiments of the present invention, the capacitor may further include a second supporting insulation layer on the first supporting insulation layer. The seconding supporting insulation layer may have a face and a second trench in the face and the lower electrode may be provided in the second trench.

In still further embodiments of the present invention, a distance between sidewalls of the second trench may be larger than a distance between sidewalls of the first trench such that the second trench exposes a portion of a surface of the first supporting insulation layer. The lower electrode may be in the second trench on the oxidation barrier conductive layer and the surface of the first supporting insulation layer.

In some embodiments of the present invention, the capacitor may further include an insulation layer on the integrated circuit substrate that defines a contact hole exposing at least a portion of an active region of the integrated circuit substrate. A contact plug may be provided in the contact hole and the first supporting insulation layer may be provided on the insulation layer. The first trench may expose a surface of the contact plug and at least a portion of the insulation layer around the contact plug. The ferroelectric layer may be on the second supporting insulation layer and the lower electrode.

In further embodiments of the present invention, the capacitor may further include an adhesion conductive layer between the oxidation barrier conductive layer and a surface of the conductive plug, a surface of the insulating layer and sidewalls of first supporting insulation layer.

In still further embodiments of the present invention, the contact hole may include an upper portion remote from the integrated circuit substrate and a lower portion adjacent the integrated circuit substrate. The contact plug may be provided in the lower portion of the contact hole and the oxidation barrier conductive layer may extend into the upper portion of the contact hole on the contact plug. An adhesion conductive layer may be provided between the oxidation barrier conductive layer and a surface of the conductive plug, sidewalls of the contact hole, a surface of the insulating layer and sidewalls of first supporting insulation layer.

In some embodiments of the present invention the ferroelectric layer may extend across two adjacent cell array regions including at least one ferroelectric capacitor and the upper electrode may extend on the ferroelectric layer and on first and second adjacent lower electrodes. The supporting insulation layer may include a first layer and a second layer on the first layer. The first layer may include nitride and the second layer may include oxide. In certain embodiments of the present invention, the capacitor may further include a hydrogen diffusion layer on an exposed portion of the ferroelectric layer and the upper electrode. The oxidation barrier conductive layer may include Ir, TiAlN, TiN and/or Ru. Accordingly, embodiments of the present invention may provide improved ferroelectric capacitors and methods of fabricating ferroelectric capacitors.

While the present invention is described above primarily with reference to ferroelectric capacitors, methods of fabricating ferroelectric capacitors are also provided herein.

DETAILED DESCRIPTION

Figure 1A:
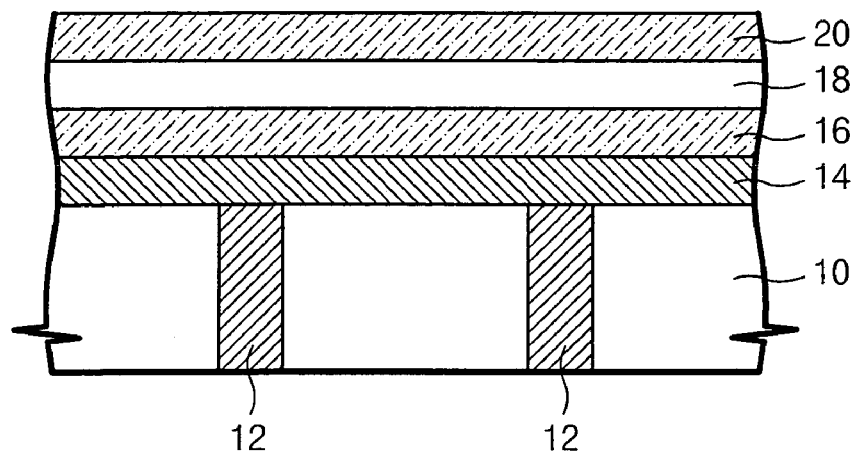
FIGS. 1A and 1B are cross-sectional views illustrating conventional ferroelectric capacitors.
Figure 1B:
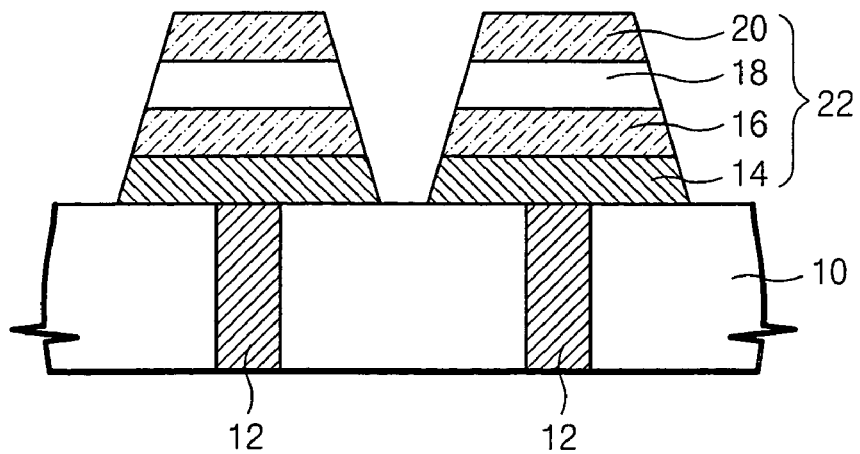

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" or "beneath" another element, it can be directly under the other element or intervening elements may also be present. It will be understood that when part of an element is referred to as "outer," it is closer to the outside of the integrated circuit than other parts of the element. Like numbers refer to like elements throughout.

Furthermore, relative terms, such as beneath, may be used herein to describe an element's relationship to another as illustrated in the Figures. It will be understood that these terms are intended to encompass different orientations of the elements in addition to the orientation depicted in the Figures. For example, if a Figure is inverted, the elements described as "beneath" other elements would be oriented "above" these other elements. The relative terms are, therefore, intended to encompass all possible arrangements of the elements and not just the ones shown in the Figures.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention will be described below with respect to FIGS. 2 through 9G. Embodiments of the present invention provide ferroelectric capacitors including a supporting insulation layer having a face and a trench in the face, an oxidation barrier conductive layer in the trench and a lower electrode on the oxidation barrier conductive layer. In certain embodiments of the present invention the lower electrode is disposed in the trench in the face of the supporting insulation layer. In further embodiments of the present invention, the lower electrode is disposed in a second trench in a face of a second supporting insulation layer on the first supporting insulation layer. Accordingly, ferroelectric capacitors according to embodiments of the present invention may provide improved device characteristics as discussed further below.

Figure 2:
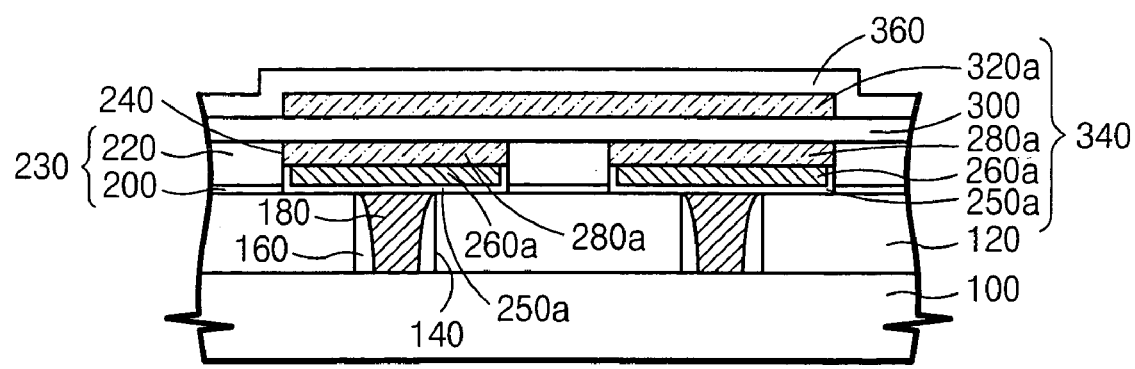
FIG. 2 is a cross-sectional view illustrating ferroelectric capacitors according to some embodiments of the present invention.

Referring now to FIG. 2, a cross-sectional view illustrating ferroelectric capacitors according to some embodiments of the present invention will be discussed. As illustrated in FIG. 2, a ferroelectric capacitor 340 includes an oxidation barrier conductive layer 260a, a lower electrode 280a on the oxidation barrier conductive layer 260a, a ferroelectric layer 300 on the lower electrode 280a and an upper electrode 320a on the ferroelectric layer 300. An insulation layer 120 is provided on an integrated circuit substrate 100 having one or more active regions (not shown). The ferroelectric capacitor 340 is provided on the insulation layer 120 and is electrically connected to an active region (not shown) of the integrated circuit substrate 100 through a contact plug 180. The contact plug 180 is provided in a contact hole 140 in a predetermined region of the insulation layer 120. The contact plug may include a conductive material, for example, polysilicon, tungsten and the like. The contact hole 140 exposes at least a portion of the active region (not shown) of the integrated circuit substrate 100. Insulation spacers 160 may also be provided on sidewalls of the contact hole 140 as illustrated in FIG. 2.

As further illustrated in FIG. 2, a trench 240 is provided in a face of the supporting insulation layer 230 on the insulation layer 120. In certain embodiments of the present invention, the supporting insulation layer 230 may include first and second layers. The first layer may be, for example, a nitride layer 200, and the second layer may be, for example, an oxide layer 220. For example, the nitride layer 200 may include a silicon nitride (SiN) layer and/or a silicon oxynitride (SiON) layer. The first layer may be provided on the insulation layer 120 and the second layer may be provided on the first layer as illustrated in FIG. 2.

The trench 240 exposes a surface of the contact plug 180 and at least a portion of a surface of the insulation layer 120 around the contact plug 180. In some embodiments of the present invention illustrated in FIG. 2, the oxidation barrier conductive layer 260a is provided in a lower portion of the trench 240 and the lower electrode 280a is provided in an upper portion of the trench 240 on the oxidation barrier conductive layer. The oxidation barrier conductive layer 260a may include, for example, Ir, TiN, TiAlN and/or Ru. In certain embodiments of the present invention, the lower electrode 280a is provided on an entire surface of the oxidation barrier conductive layer 260a. Thus, the oxidation barrier conductive layer 260a is electrically connected to the contact plug 180, which in turn electrically connects the oxidation barrier conductive layer 260a to the integrated circuit substrate 100 through the contact plug 180. In certain embodiments of the present invention, the lower electrode 280a may be provided on the oxidation barrier conductive layer 260a such that a surface of the lower electrode 280a may be substantially planar with a surface of the supporting insulation layer 230. The trench 240, the oxidation barrier conductive layer 260a and the lower electrode 280a may be aligned in cell array regions of the integrated circuit substrate 100 and may be electrically insulated from adjacent devices by the supporting insulation layer 230.

According to embodiments of the present invention, the thickness of, for example, the oxidation barrier conductive layer 260a and the lower electrode 280a may be adjusted to a desired thickness without experiencing the potential problems discussed above with respect to conventional ferroelectric capacitors. Accordingly, the thickness of the oxidation barrier conductive layer may be chosen to provide an improved contact resistance with a surface of the contact plug according to embodiments of the present invention. Furthermore, the thickness of the lower electrode may be chosen to provide improved material characteristics of the ferroelectric layer.

Referring again to FIG. 2, the ferroelectric layer 300 is provided on the supporting insulation layer 230 and the lower electrode 280a. In certain embodiments of the present invention, the ferroelectric layer 300 may be provided on an entire cell array region, thus, possibly increasing an area directly contacting the upper electrode 320a. It will be understood that that the ferroelectric layer 300 is provided on the lower electrode 280a and contacts the lower electrode 280a, the lower electrode being provided between the oxidation barrier conductive layer 260a and the ferroelectric layer 300 such that the oxidation barrier conductive layer 260a is separated from the ferroelectric layer 300.

An adhesion conductive layer 250a may be provided between the oxidation barrier conductive layer 260a and the contact plug 180 as illustrated in FIG. 2. The adhesion conductive layer 250a may include, for example, TiN, and/or Ti. The adhesion conductive layer 250a is provided between the oxidation barrier conductive layer 260a and a surface of the contact plug 180, a surface of the insulation layer 120 exposed by the trench 240 and sidewalls of the trench 240. This adhesion conductive layer 250a may be provided to reinforce adhesion of the oxidation barrier conductive layer 260a.

The upper electrode 320a is provided on the ferroelectric layer 300. In certain embodiments of the present invention, the upper electrode 320a may be provided on two adjacent trenches 240, i.e., two neighboring lower electrodes 260a. In other words, a portion of the ferroelectric layer 300 may be exposed between some trenches 240 of the integrated circuit device as illustrated in FIG. 2. A hydrogen diffusion barrier layer 360 may be provided on the upper electrode 320a and the exposed portions of the ferroelectric layer 300 to protect the ferroelectric capacitor 340.

Figure 3:
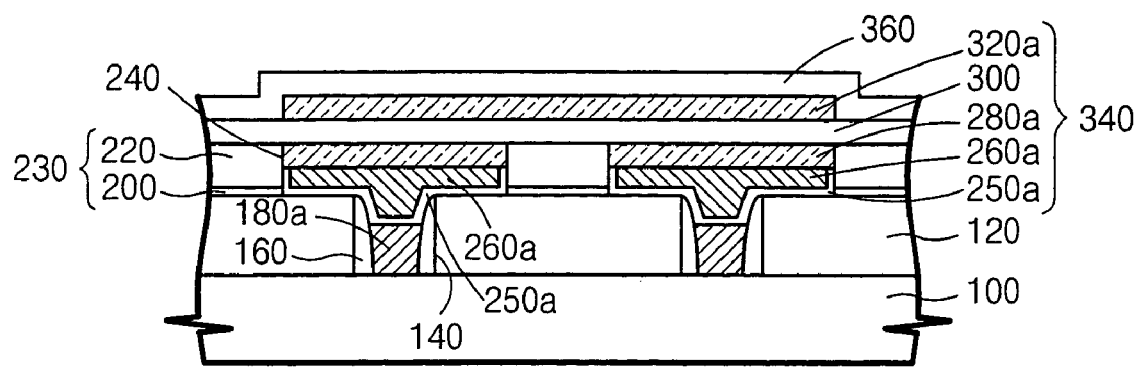
FIG. 3 is a cross-sectional view illustrating ferroelectric capacitors according to further embodiments of the present invention.

Referring now to FIG. 3, a cross sectional view illustrating ferroelectric capacitors according to further embodiments of the present invention will be discussed. The ferroelectric capacitor 340 illustrated in FIG. 3 includes many elements similar to those discussed above with respect to FIG. 2. Thus, in the interest of brevity the details with respect to the similar elements will not be repeated herein. As illustrated in FIG. 3, the contact hole 140 includes a lower portion and an upper portion. The contact plug 180a is provided in a lower portion of the contact hole 140, i.e., the contact plug 180a is recessed beneath the surface of the insulation layer 120. The oxidation barrier conductive layer 260a is provided on the contact plug 180a in the upper portion of the contact hole 140 on the recessed contact plug 180a. In other words, the oxidation barrier conductive layer 260a extends into an upper portion of the contact hole 140. Accordingly, in embodiments of the present invention illustrated in FIG. 3, a distance between the contact plug 180a and the lower electrode 280a may be increased.

Thus, the oxidation barrier conductive layer 260a illustrated in FIG. 3 is provided in an upper portion of the contact hole 140 and in a lower portion of the trench 240 in the supporting insulation layer 230. Similar to FIG. 2, a lower electrode 280a is provided in the upper portion of the trench 240. In addition, an adhesion conductive layer 250a is provided between the oxidation barrier conductive layer 260a and a surface of the contact plug 180a, sidewalls of the contact hole 140, a surface of the insulating layer 120 and sidewalls of the trench 140. The ferroelectric layer 300, the upper electrode 320a and the hydrogen diffusion barrier layer 360 are provided in a way similar to that discussed above with respect to the ferroelectric capacitor of FIG. 2 and will not be discussed further herein.

Figure 4:
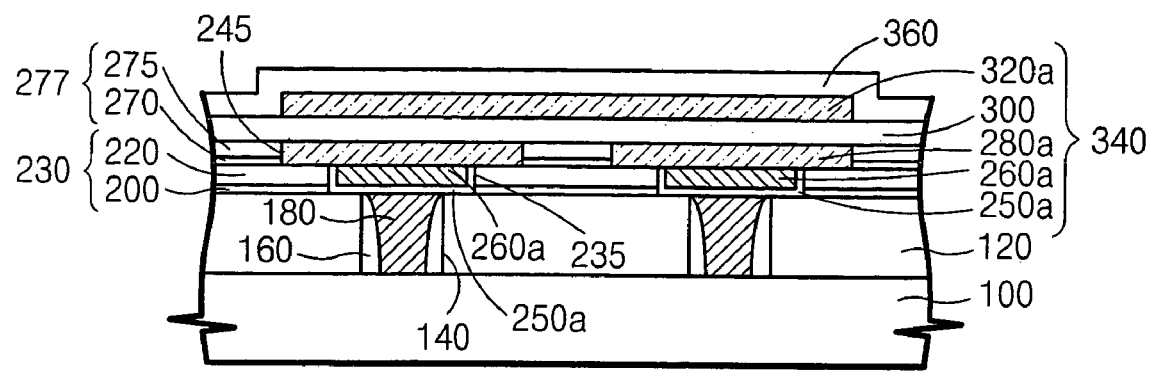
FIG. 4 is a cross-sectional view illustrating ferroelectric capacitors according to still further embodiments of the present invention.

Referring now to FIG. 4, a cross-sectional view illustrating a ferroelectric capacitor according to still further embodiments of the present invention will be discussed. The details with respect to the integrated circuit substrate 100, the insulation layer 120, the contact plug 180, the contact hole 140, the spacers 160, the adhesion conductive layer 250a, the ferroelectric layer 300, the upper electrode 320a and the hydrogen diffusion barrier layer 360 are similar to those discussed above with respect to FIG. 2 and in the interest of brevity will not be discussed further herein. As illustrated in FIG. 4, a first trench 235 is provided in the face of a first supporting insulation layer 230 on the insulation layer 120. The oxidation barrier conductive layer 260a is provided in the first trench 235 in the first supporting insulation layer 230. In certain embodiments of the present invention, a surface of the oxidation barrier conductive layer 260a may be substantially planar with a surface of the first supporting insulation layer. The first trench 235 exposes a surface of the contact plug 180 provided in the contact hole 140 in the insulation layer 120 and at least a portion of the insulation layer 120 around the contact plug 180.

As further illustrated in FIG. 4, a second supporting insulation layer 277 is provided on the first supporting insulation layer 230. The second supporting insulation layer has a face and a second trench 245 in the face. The lower electrode 280a is provided in the second trench 245 in the second supporting insulation layer 277 on the oxidation barrier conductive layer 260a. The second trench 245 exposes a surface of the oxidation barrier conductive layer 260a and at least a portion of the first supporting insulation layer 230 around to the oxidation barrier conductive layer 260a. In other words, a distance between sidewalls of the second trench 245 is larger than a distance between sidewalls of the first trench 235 such that the second trench 245 exposes at least a portion of the surface of the first supporting insulation layer 230 around the oxidation barrier conductive layer 260a. Furthermore, the lower electrode 280a is provided in the second trench 245 in the face of the second supporting insulation layer 277 on the oxidation barrier conductive layer 260a and the surface of the first supporting insulation layer 230.

In certain embodiments of the present invention, the first and second supporting insulation layers 230 and 277 may include a first layer and a second layer on the first layer. The first layer may include, for example, a nitride layer 200, 270 and the second layer may include, for example, an oxide layer 220, 275 on the nitride layer 200, 270. An adhesion conductive layer 250a, a ferroelectric layer 300, an upper electrode 320a and a hydrogen diffusion barrier layer 360 are provided in the same way as discussed above with respect to the ferroelectric capacitor of FIG. 2 and will not be discussed further herein.

Figure 5:
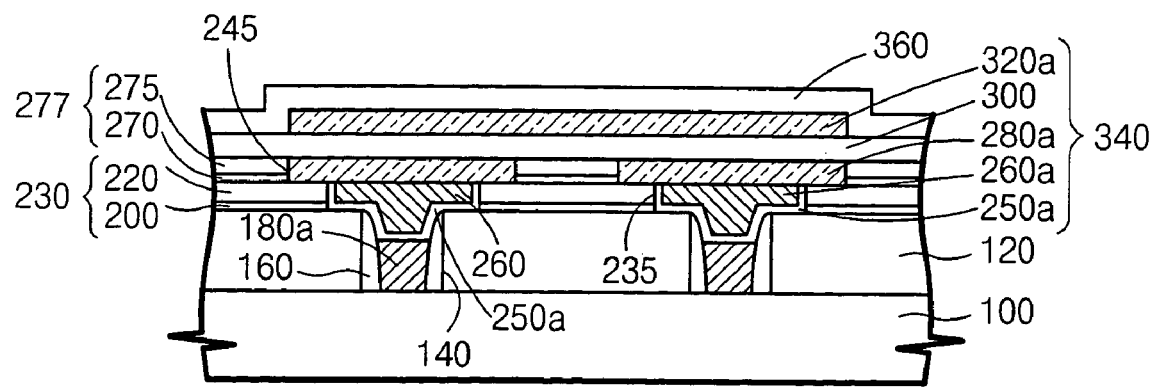
FIG. 5 is a cross-sectional view illustrating ferroelectric capacitors according to some embodiments of the present invention.

Referring now to FIG. 5, a cross-sectional view illustrating ferroelectric capacitors according to some embodiments of the present invention will be discussed. The ferroelectric capacitor 340 illustrated in FIG. 5 includes many elements similar to those discussed above with respect to FIG. 4. Thus, in the interest of brevity the details with respect to the common elements will not be repeated herein. As illustrated in FIG. 5, the contact hole 140 includes a lower portion and an upper portion. The contact plug 180a is provided in the lower portion of the contact hole 140, i.e., the contact plug 180a is recessed beneath the surface of the insulation layer 120. The oxidation barrier conductive layer 260a is provided on the contact plug 180a in the upper portion of the contact hole 140. In other words, the oxidation barrier conductive layer 260a extends into an upper portion of the contact hole 140. Accordingly, in embodiments of the present invention illustrated in FIG. 5, a distance between the contact plug 180a and the lower electrode 280a may be increased.

Thus, the oxidation barrier conductive layer 260a illustrated in FIG. 5 is provided in an upper portion of the contact hole 140 and in the first trench 235 in the first supporting insulation layer 230. Similar to FIG. 4, a lower electrode 280a is provided in the second trench 245. In addition, an adhesion conductive layer 250a is provided between the oxidation barrier conductive layer 260a and a surface of the contact plug 180a, sidewalls of the contact hole 140, a surface of the insulating layer 120 and sidewalls of the trench 140. The ferroelectric layer 300, the upper electrode 320a and the hydrogen diffusion barrier layer 360 are provided in a way similar to that discussed above with respect to the ferroelectric capacitor of FIG. 4 and will not be discussed further herein.

It will be understood that although embodiments of the present invention illustrated in FIGS. 2 through 5 include two ferroelectric capacitors 340, embodiments of the present invention are not limited to this configuration. For example, embodiments of the present invention may include a single ferroelectric capacitor or more than two ferroelectric capacitors without departing from the teachings of the present invention.

Figure 6A:
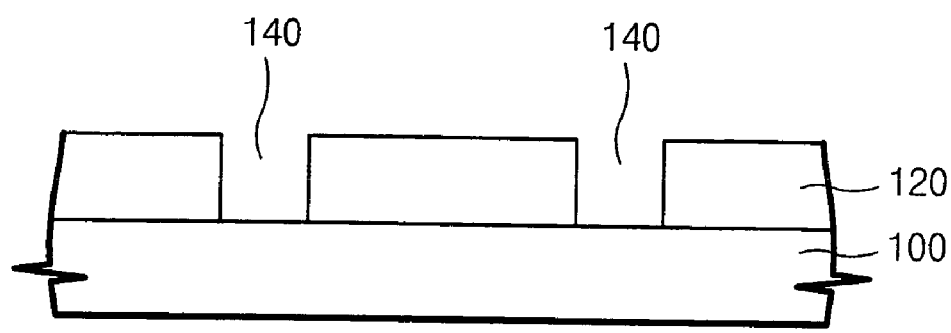
FIGS. 6A through 6I are cross-sectional views illustrating processing steps in the fabrication of integrated circuit devices according to embodiments of the present invention illustrated in FIG. 2.

Methods of fabricating ferroelectric capacitors according to embodiments of the present invention will now be discussed with respect to FIGS. 6A through 9G. Referring now to FIGS. 6A through 6I, processing steps in the fabrication of ferroelectric capacitors according to embodiments of the present invention illustrated in FIG. 2 will be discussed. Referring now to FIG. 6A, a conventional isolation process is performed to define an active region (not shown) and a device isolation region in the integrated circuit substrate 100. A gate electrode and a bit line (not shown) are formed using a conventional method and an insulation layer 120 is formed on the integrated circuit substrate 100. The insulation layer 120 is patterned to form a contact hole 140 exposing the active region (not shown) of the integrated circuit substrate 100. The active region (not shown) may provide a source region formed in the integrated circuit substrate 100 outside the gate electrode. The bit line may be electrically connected to a drain region formed in the integrated circuit substrate 100 outside of the gate electrode and opposite the source region. The insulation layer 120 may include, for example, an oxide. The insulation layer 120 may further include first and second layers. The first layer may include, for example, an oxide, and the second layer may include, for example, a nitride.

Figure 6B:
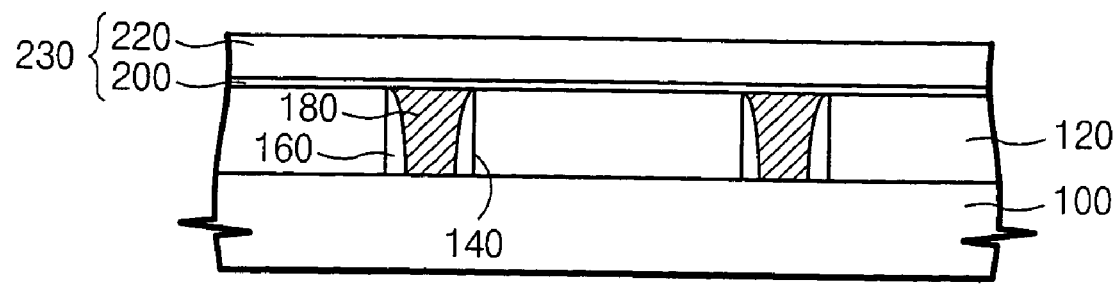

Referring now to FIG. 6B, a plug conductive material is formed on the insulation layer 120 in the contact hole 140. The plug conductive material is planarized to form a contact plug 180 in the contact hole 140. The contact plug 180 may include, for example, polysilicon, tungsten and the like. Optional insulation spacers 160 may be formed on sidewalls of the contact hole 140 prior to forming the plug conductive material on the insulation layer 120.

A supporting insulation layer 230 is formed on the contact plug 180 and the insulation layer 120. The supporting insulation layer 230 may include a first layer 200 of, for example, nitride, and a second layer 220 of, for example, oxide. The first layer 200 may be formed on the insulation layer 120 and the contact plug 180 and the second layer 220 may be formed on the first layer 200.

Figure 6C:
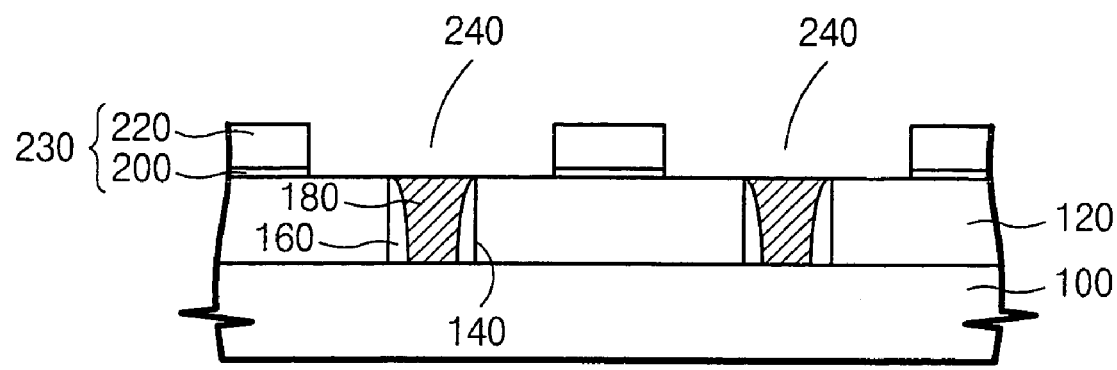

Referring now to FIG. 6C, the supporting insulation layer 230 is patterned to form a trench 240 exposing a surface of the contact plug 180 and at least a portion of a surface of the insulation layer 120 around the contact plug 180. In particular, the second layer 220, for example, an oxide layer, may be etched using the first layer 200, for example, a nitride layer, as an etch stop layer. The first layer 200 may then be etched to expose a surface of the contact plug and at least a portion of the insulation layer 120 around the contact plug 180.

Figure 6D:
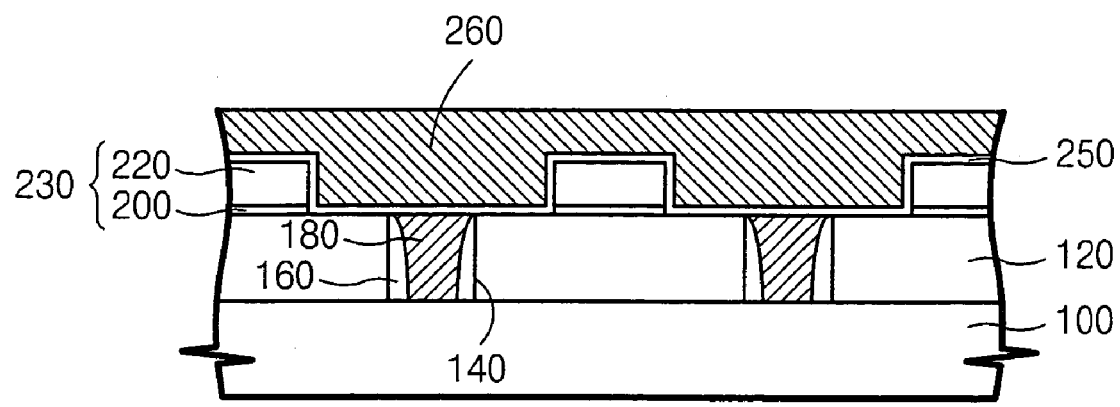

Referring now to FIG. 6D, an adhesion conductive material 250 can be formed uniformly along a shape of the trench 240, i.e., on a bottom and sidewalls of the trench 240. The adhesion conductive material 250 may include, for example, TiN and/or Ti. An oxidation barrier conductive material 260 is formed on the adhesion conductive material 250. The oxidation barrier conductive material 260 may include, for example, Ir, TiN, TiAlN and/or Ru. It will be understood that the oxidation barrier conductive material may be formed on the insulation layer and the adhesion conductive material may be omitted without departing from the teachings of the present invention. The adhesion conductive material 250 may improve adhesion properties of the oxidation barrier conductive material 260 and an underlying layer, i.e., the surface of the insulation layer 120 and the surface of the contact plug 180.

Figure 6E:
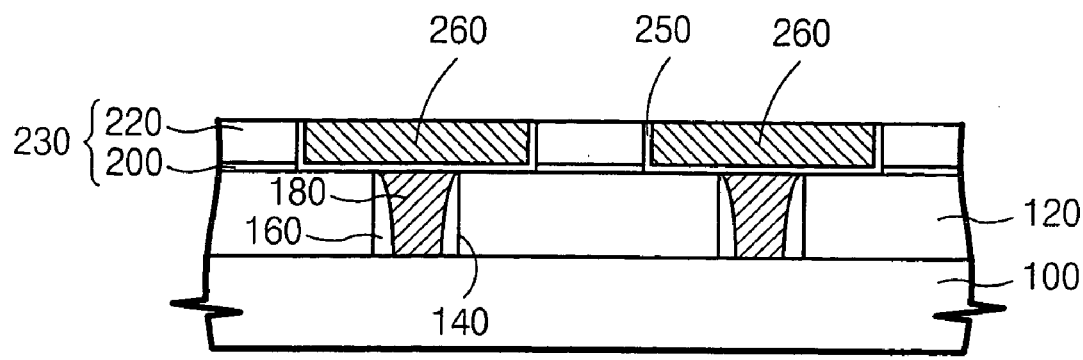

Referring now to FIG. 6E, a planarization process is performed on the oxidation barrier conductive material 260 until at least a portion of a surface of the supporting insulation layer 230 is exposed. The planarization process may include, for example, a chemical mechanical polishing (CMP) and/or an etch back process.

Figure 6F:
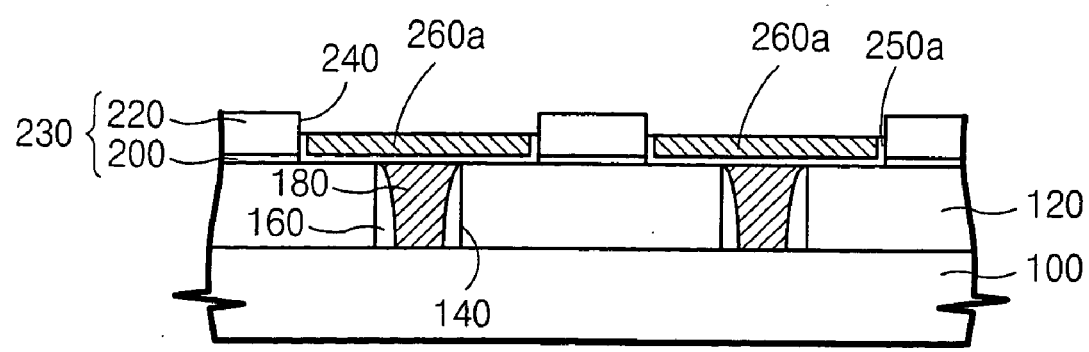

Referring to FIG. 6F, the oxidation conductive material 260 and the adhesion conductive material 250 are etched back to form an oxidation barrier conductive layer 260a and an adhesion conducive layer 250a in a lower portion of the trench 240. The portion of the oxidation barrier conductive material 260 removed during the etch back process may be determined based on the desired thickness of the oxidation barrier conductive layer 260a. In other words, the oxidation barrier conductive material 260 may be etched back until the oxidation barrier conductive layer 260a reaches a desired thickness.

Figure 6G:
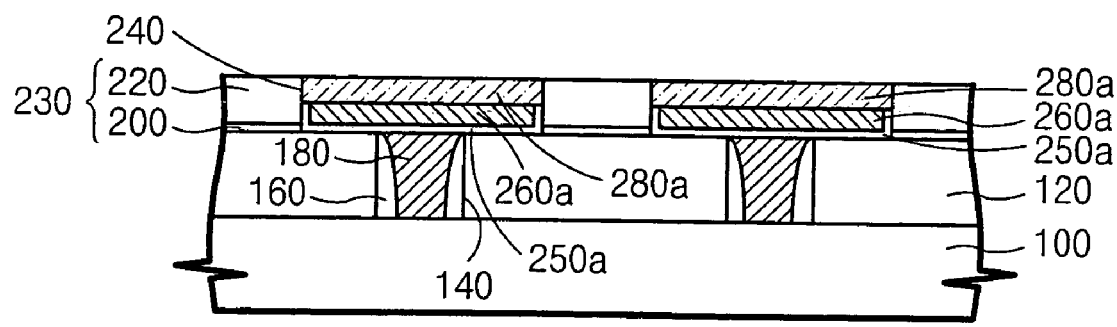

Referring now to FIG. 6G, a lower electrode 280a is formed in the upper portion of the trench 240. In particular, a lower electrode material is formed on the supporting insulation layer 230 and in the trench 240 and a planarization process is performed until the a portion of the surface of the supporting insulation layer 230 is exposed. The planarization process may be, for example, a CMP process and/or an etch back process. The planarization process may be adjusted to achieve a lower electrode 280a having a desired thickness. In certain embodiments of the present invention, a surface of the lower electrode 280a may be substantially planar with the surface of the supporting insulation layer 230. The lower electrode material may include, for example, a noble metal and/or a conductive oxide. The noble metal may include, for example, platinum (Pt), iridium (Ir), and/or ruthenium (Ru) and the conductive oxide may include, for example, iridium dioxide (IrO2) and/or ruthenium dioxide (RuO2).

Figure 6H:
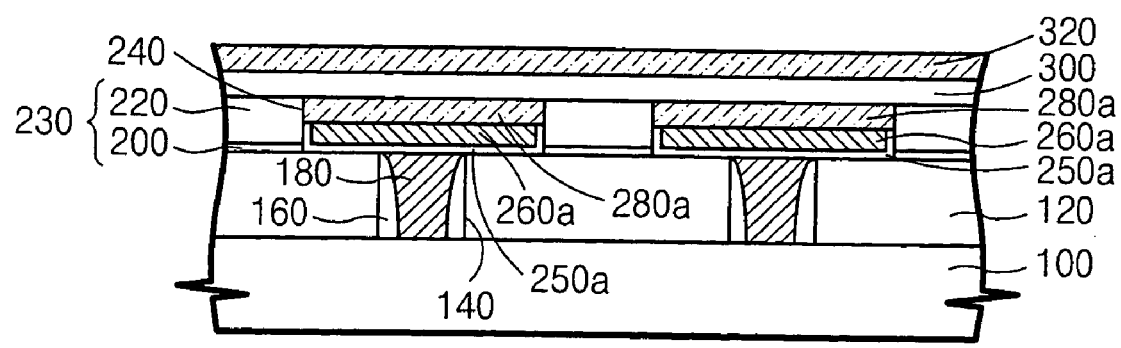

Referring now to FIG. 6H, a ferroelectric material 300 is formed on the surface of the supporting insulation layer 230 and the lower electrode 280a. An upper electrode material 320 is formed on the surface of the ferroelectric material 300. The ferroelectric layer 300 may be formed using, for example, a sol-gel process, a physical vapor deposition (PVD) process and/or a chemical mechanical deposition (CVD) process. The upper electrode material may be formed of, for example, a noble metal and/or conductive oxide. The lower electrode 280a may cover the surface of the oxidation barrier conductive layer 260a such that the ferroelectric layer 300 may be formed on the lower electrode 280a and the supporting insulation layer 230 having good characteristics and morphology. In certain embodiments of the present invention, PbTiO3 and TiO2 (not shown) may be formed as a seeding layer prior to forming the ferroelectric layer 300. The seeding layer may improve material properties of the ferroelectric layer 300.

Figure 6I:
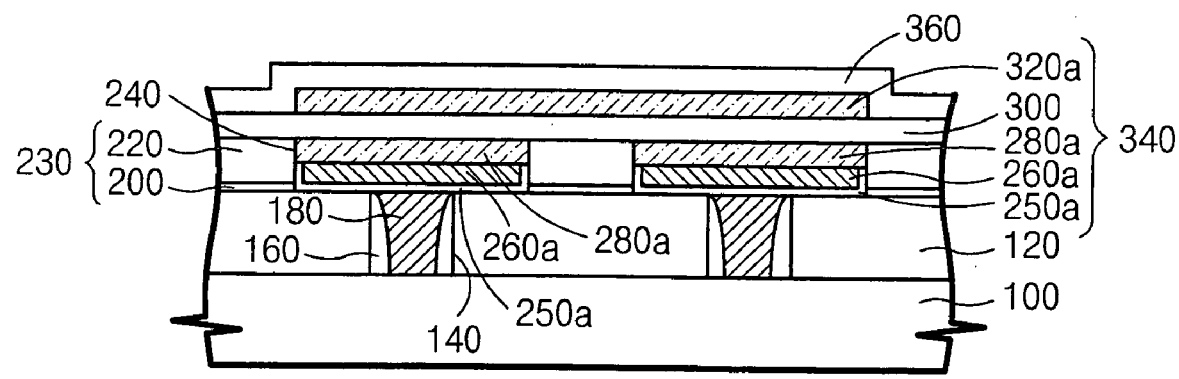

Referring now to FIG. 6I, the upper electrode material 320 is patterned to form an upper electrode 320a covering adjacent lower electrodes. A hydrogen diffusion layer 360 is formed on the upper electrode 320a and the ferroelectric layer 300 exposed by the upper electrode 320a. The hydrogen diffusion layer 300 may be formed of, for example, TiO2 and/or Al2O3. The hydrogen diffusion layer 360 may reduce the likelihood that the ferroelectric layer 300 will degrade properties thereof in subsequent processes.

According to certain embodiments of the present invention, the ferroelectric layer may be formed after patterning the lower electrode and the oxidation barrier conductive layer. Therefore, the ferroelectric layer may not be exposed to an oxygen ambient during an etch of the lower electrode and the oxidation barrier conductive layer. Moreover, the ferroelectric layer may not be divided into a unit cell, so that the ferroelectric layer may not be damaged by the etchant.

Furthermore, the oxidation barrier conductive layer and the lower electrode may be formed without limiting process conditions based on the ferroelectric layer because the oxidation barrier conductive layer and the lower electrode may be patterned prior to forming the ferroelectric layer material. In other words, the oxidation barrier conductive layer can be formed to have a thickness that may effectively protect oxidation. Moreover, a thermal process having a high temperature can be performed so as to improve layer properties. Furthermore, an improved ferroelectric layer may be formed by adjusting a thickness of the lower electrode that essentially affects a crystallization of the ferroelectric layer.

Figure 7A:
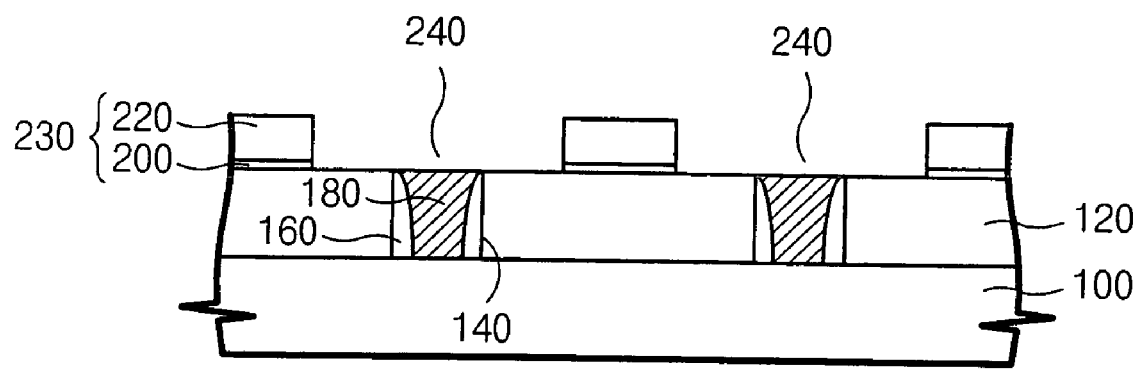
FIGS. 7A through 7F are cross-sectional views illustrating processing steps in the fabrication of integrated circuit devices according to embodiments of the present invention illustrated in FIG. 3.

Referring now to FIGS. 7A through 7F, processing steps in the fabrication of ferroelectric capacitors according to embodiments of the present invention illustrated in FIG. 3 will be discussed. Referring now to FIG. 7A, a gate electrode, a bit line, an insulation layer 120, a contact hole 140, a contact plug 180, sidewall spacers 160 and a supporting insulation layer 230 are formed using similar methods to those discussed above with respect to FIGS. 6A–6C and in the interest of brevity will not be discussed further herein.

Figure 7B:
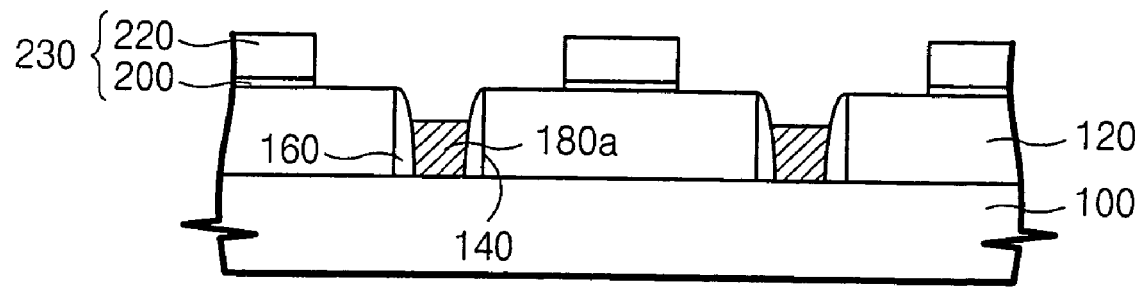
Figure 7C:
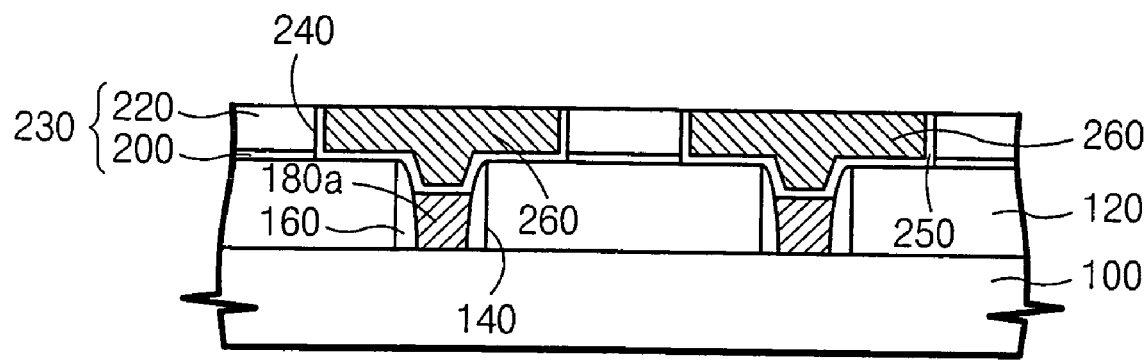
Figure 7D:
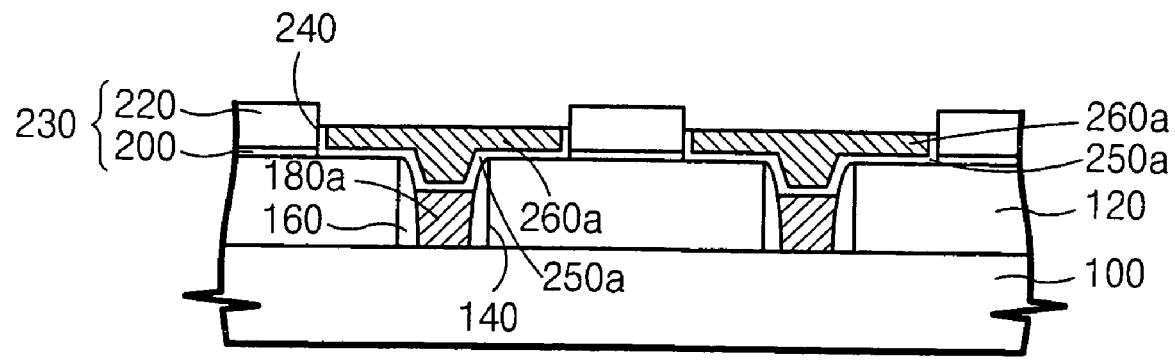
Figure 7E:
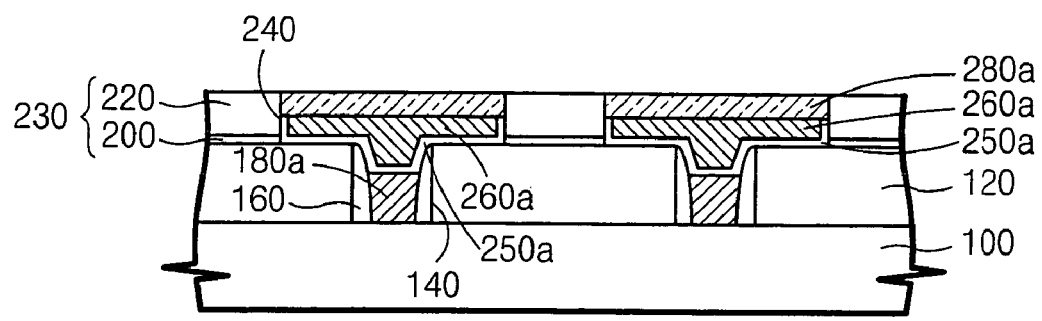
Figure 7F:
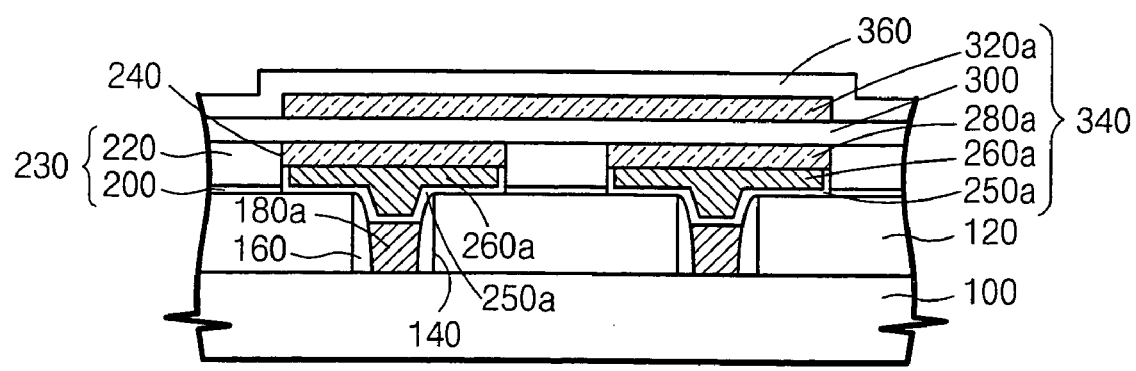

Referring now to FIG. 7B, a surface of the contact plug 180 exposed by the trench 240 is further etched to form a contact plug 180a that is recessed beneath a surface of the insulation layer 120. Referring now to FIG. 7C, an adhesion conductive material 250 and an oxidation barrier conductive material 260 are sequentially formed in the upper portion of the contact hole 180a and in the trench 240. The oxidation barrier conductive material 260 and the adhesion conductive material 250 are etched back to form an adhesion conductive layer 250a and an oxidation barrier conductive layer 260a in an upper portion of the contact hole 140 and the lower portion of the trench 240 as illustrated in FIG. 7D. A lower electrode 280a is formed in the upper portion of the trench 240 as illustrated in FIG. 7E. A ferroelectric layer 300, an upper electrode 320 and a hydrogen diffusion barrier layer 360 are formed as illustrated in FIG. 7F as discussed above with respect to FIGS. 6H and 6I.

Figure 8A:
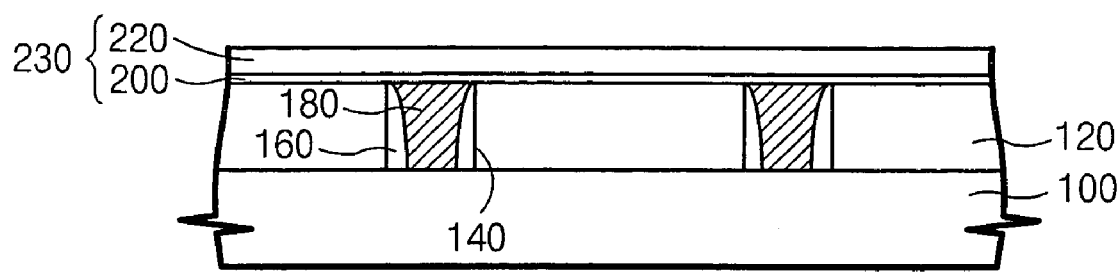
FIGS. 8A through 8G are cross-sectional views illustrating processing steps in the fabrication of integrated circuit devices according to embodiments of the present invention illustrated in FIG. 4.

Referring now to FIGS. 8A through 8G, processing steps in the fabrication of ferroelectric capacitors according to embodiments of the present invention illustrated in FIG. 4 will be discussed. Referring to FIG. 8A, a gate line, a bit line, an insulation layer 120, a contact hole 140, sidewall spacers 160, a contact plug 180 and a first supporting insulation layer 230 are formed on a substrate 100 as discussed above with respect to FIGS. 6A and 6B. The first supporting insulation layer 230 is formed by, for example, forming a nitride layer 200 on the insulation layer 120 and an oxide layer 220 on the nitride layer 200.

Figure 8B:
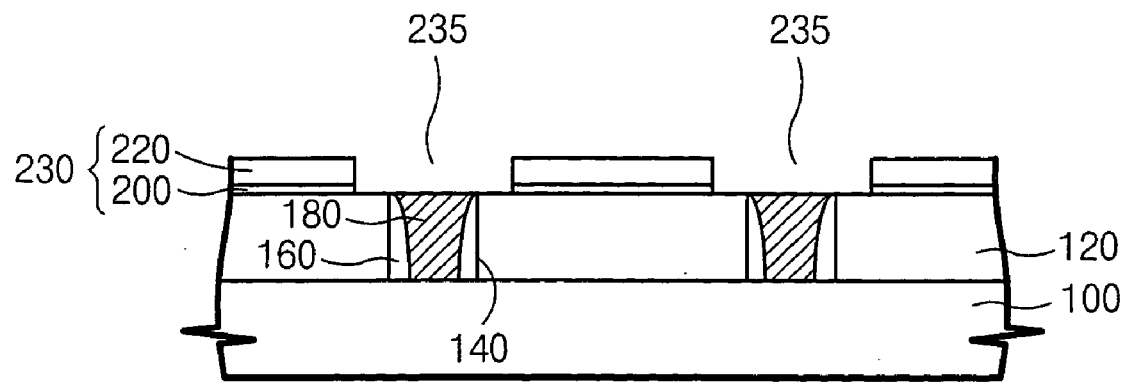
Figure 8C:
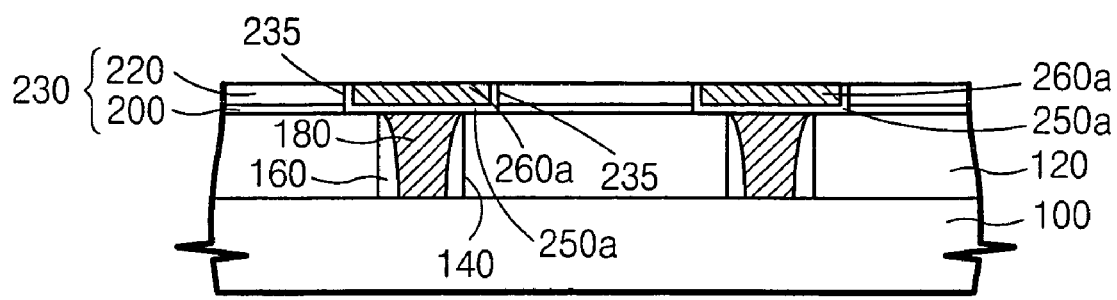

Referring now to FIG. 8B, the first supporting insulation layer 230 is patterned to form a first trench 235 exposing a surface of the contact plug 180 and a portion of an adjacent insulation layer 120 around the contact plug 180. Referring now to FIG. 8C, an oxidation barrier conductive layer 260a is formed in the first trench 235. In particular, an oxidation barrier conductive material is formed on the first supporting insulation layer 230 and in the first trench 235. The oxidation barrier conductive material is planarized to electrically insulate the adjoining trench. In certain embodiments of the present invention, the planarization process may be adjusted to form an oxidation barrier conductive layer 260a having a desired thickness. For example, if a thickness of the first supporting insulation layer 230 is similar to the thickness of the oxidation barrier conductive layer 260a, the planarization process may be interrupted when a surface of the first supporting insulation layer 230 is exposed. Furthermore, if a thickness of the first supporting insulation layer 230 is thicker than a thickness of the oxidation barrier conductive layer 260a, a portion of the first supporting insulation layer 230 may be etched by the planarization process so as to achieve a oxidation barrier conductive layer of a desired thickness. An adhesion conductive layer 250a may be formed on sidewalls and a bottom of the first trench 235 before forming the oxidation barrier conductive layer 260a.

Figure 8D:
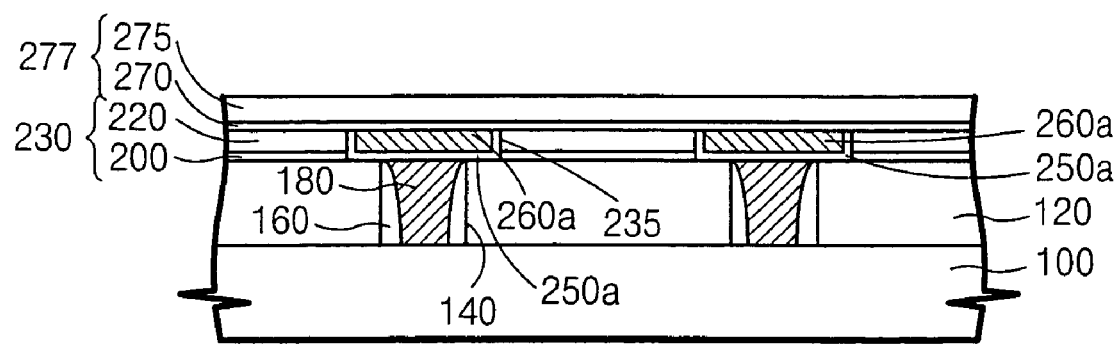

Referring now to FIG. 8D, a second supporting insulation layer 277 may be formed on the oxidation barrier conductive layer 260a and the first supporting insulation layer 230. For example, the second supporting insulation layer 277 may be formed by forming a nitride layer 270 on the first supporting insulation layer 230 and forming an oxide layer 275 on the nitride layer 270.

Figure 8E:
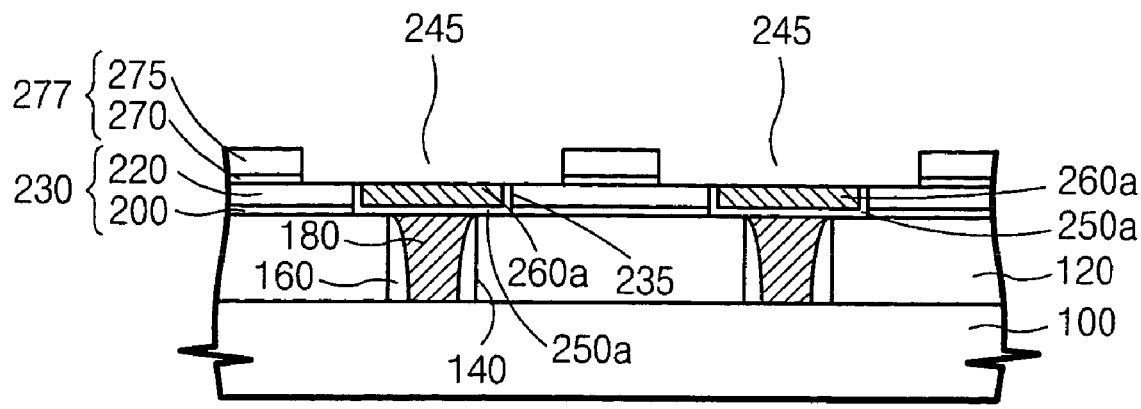

Referring now to FIG. 8E, the second supporting insulation layer 277 is patterned to form a second trench 245 exposing the oxidation barrier conductive layer 260a. In certain embodiments of the present invention, the second trench 245 may further expose a portion of a first supporting insulation layer 230 around the oxidation barrier conductive layer 260a.

Figure 8F:
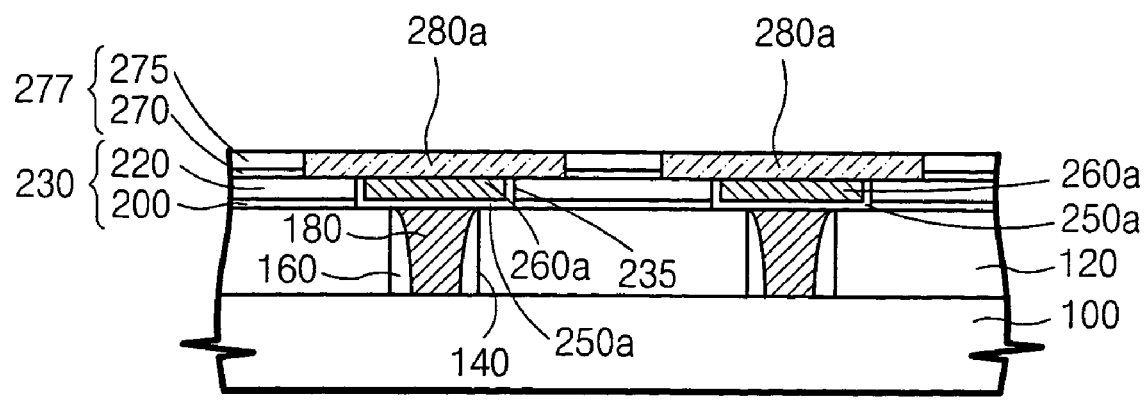
Figure 8G:
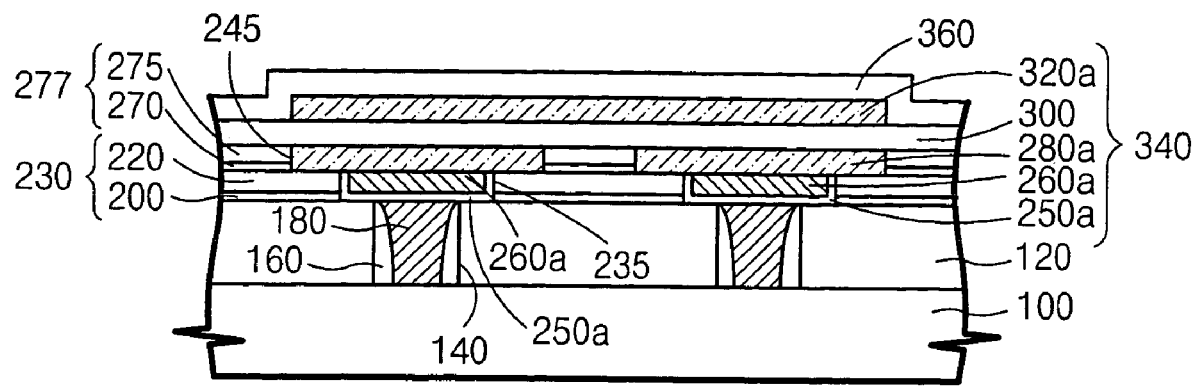

Referring now to FIG. 8F, a lower electrode 280a is formed in second trench 245. In certain embodiments, the lower electrode material is formed on the second supporting insulation layer 277 in the second trench 245 and a planarization process is performed to electrically insulate the adjoining trenches 245. The planarization process may be performed based on the thicknesses of the second supporting insulation layer 277 and the lower electrode. A ferroelectric layer 300, an upper electrode 320a and a hydrogen diffusion barrier layer 360 are formed as illustrated in FIG. 8G using similar methods as those discussed above with respect to FIGS. 6H and 6I.

Figure 9A:
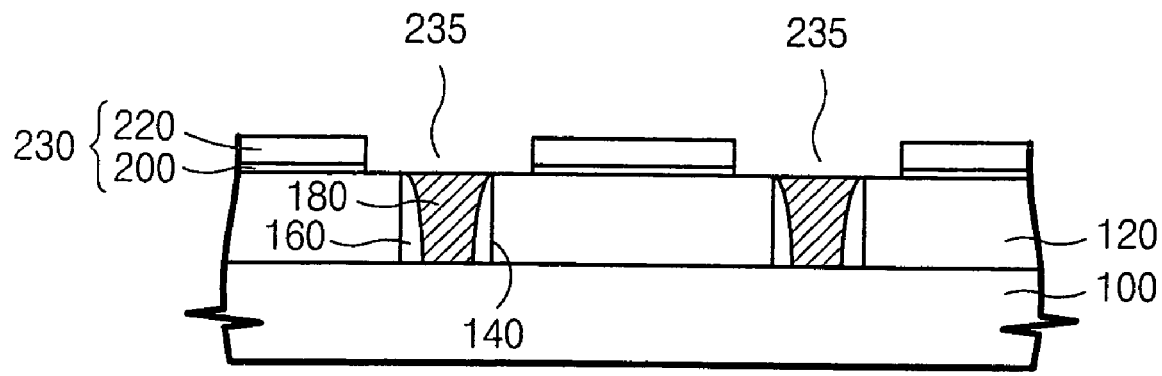
FIGS. 9A through 9G are cross-sectional views illustrating processing steps in the fabrication of integrated circuit devices according to embodiments of the present invention illustrated in FIG. 5.

Referring now to FIGS. 9A–9G, processing steps in the fabrication of ferroelectric capacitors according to embodiments of the present invention illustrated in FIG. 5 will be discussed. Referring now to FIG. 9A, a gate line, a bit line, an insulation layer 120, a contact hole 140, sidewall spacers 160, a contact plug 180, a first supporting insulation layer 230 and a first trench 235 are formed in similar to those like named elements discussed above with respect to FIGS. 8A and 8B and will not be discussed further herein.

Figure 9B:
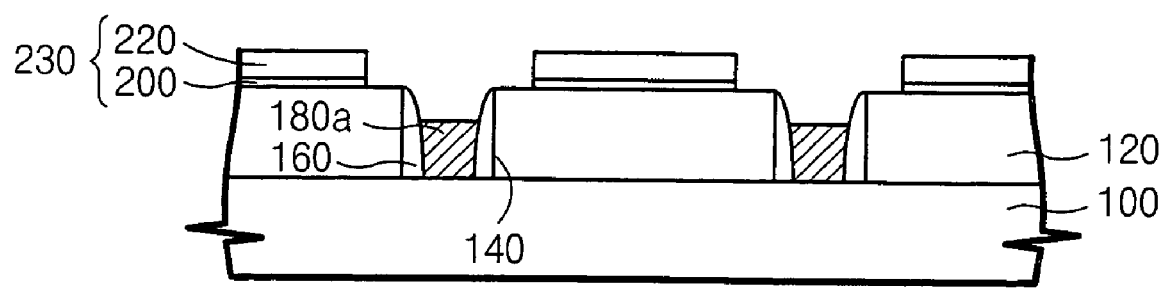
Figure 9C:
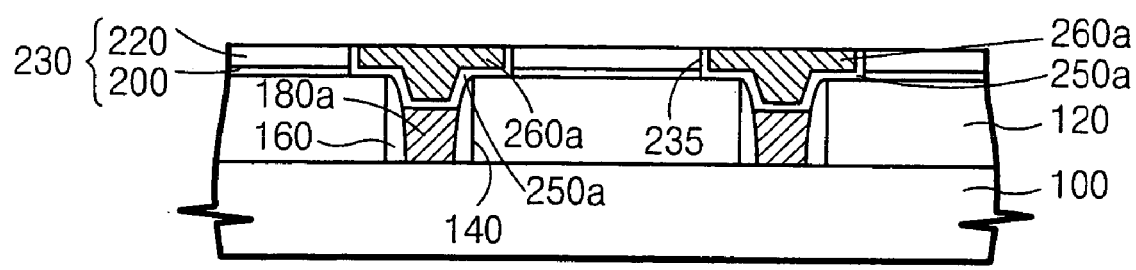

Referring now to FIG. 9B, a selective etch back process is applied to a contact plug 180 exposed by the first trench 235. Accordingly, a surface of the contact plug 180a is recessed from a surface of the insulation layer 120. Referring now to FIG. 9C, an adhesion conductive layer 250a and an oxidation barrier conductive layer 260a are formed in the upper portion of the contact hole 140 and a first trench 235.

Figure 9D:
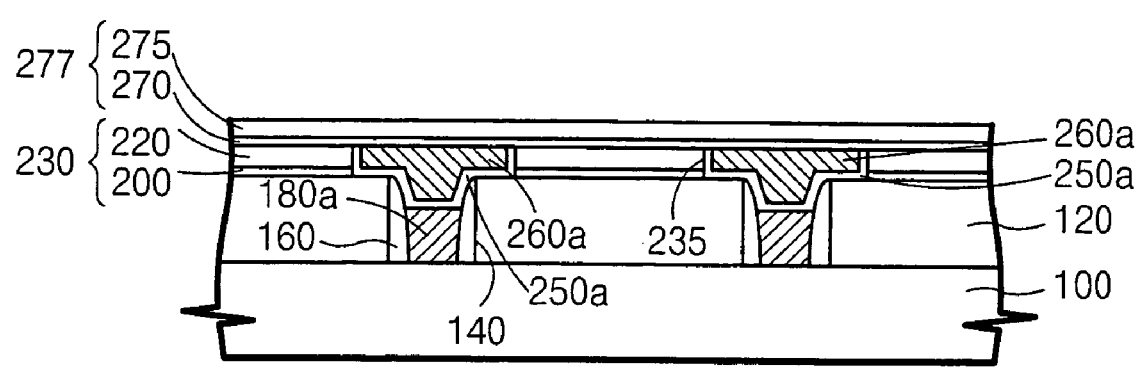
Figure 9E:
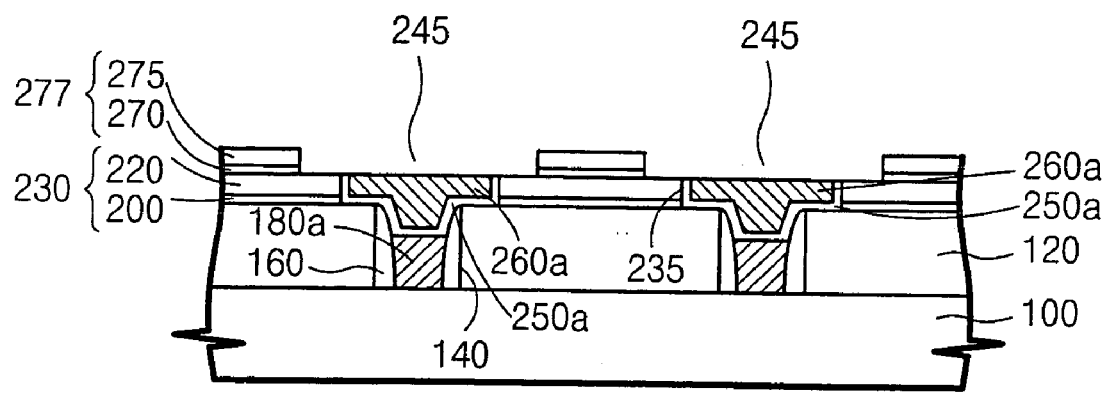
Figure 9F:
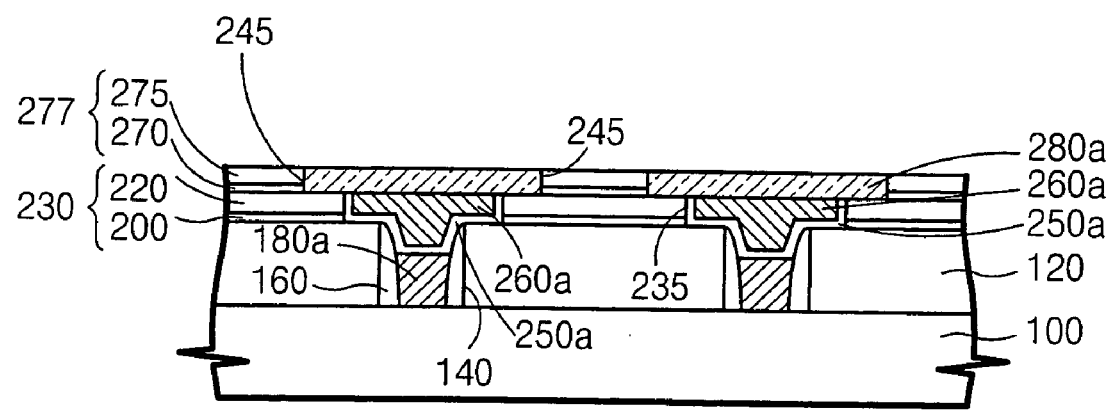
Figure 9G:
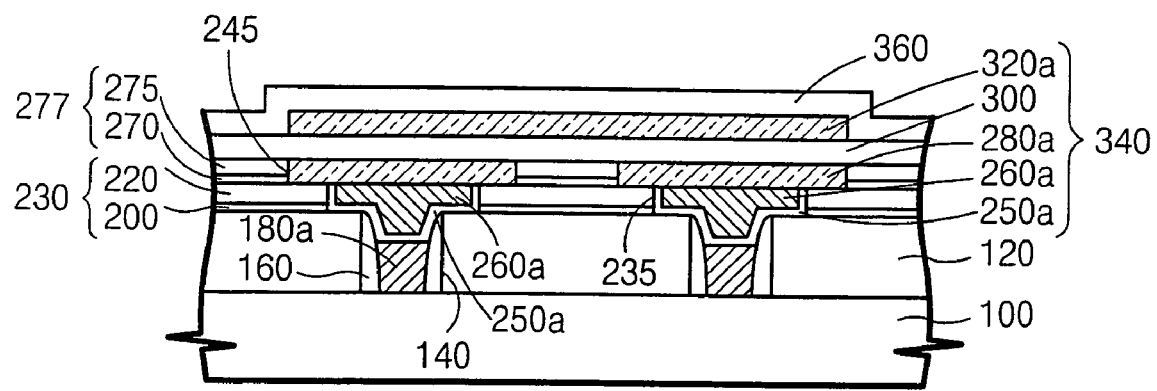

Referring now to FIG. 9D, a second supporting insulation layer 277 is formed on the first supporting insulation layer 230. The second supporting insulation layer 277 is patterned to form a second trench 245 exposing a surface of the oxidation barrier conductive layer 260a and a at least portion of the first supporting insulation layer 230 around the oxidation barrier conductive layer as illustrated in FIG. 9E. As further illustrated in FIG. 9F, a lower electrode 280*a* is formed in the second trench 245. Referring now to FIG. 9G, a ferroelectric layer 300, an upper electrode 320*a* and a hydrogen diffusion barrier layer 360 are formed using similar methods as those discussed above and will not be discussed further herein.

As discussed briefly above, ferroelectric capacitors according to embodiments of the present invention include an oxidation barrier conductive layer and a lower electrode provided in a trench in a supporting insulation layer. The lower electrode is provided on a surface of the oxidation barrier conductive layer. An oxidation barrier conductive layer having a desired thickness may be provided having improved contact resistance properties between a contact plug and the lower electrode. Furthermore, a lower electrode having a desired thickness and the oxidation barrier conductive layer according to embodiments of the present invention may provide improved properties of the ferroelectric layer formed on the lower electrode.

Furthermore, the ferroelectric layer according to embodiments of the present invention may not be patterned until after the lower electrode and the oxidation barrier conductive layer are formed. Accordingly, the ferroelectric layer may have improved material properties because the ferroelectric layer may not be exposed at an oxygen ambient when the lower electrode and the oxidation barrier conductive layer are etched. Furthermore, processes for forming the oxidation barrier conductive layer can be independently adjusted without limitation of a process condition for forming the ferroelectric layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A ferroelectric capacitor comprising:
a first supporting insulating layer on a substrate, the first supporting insulating layer having a first trench;
an oxidation barrier conductive layer confined in the first trench;
a second supporting insulating layer on the first supporting insulating layer, the second supporting insulating layer having a second trench exposing the oxidation barrier conductive layer and a portion of the first supporting insulating layer outside of the first trench;
a lower electrode in the second trench and contacting the oxidation barrier conductive layer and the portion of the first supporting layer outside of the first trench;
a ferroelectric layer contacting the lower electrode and the second supporting insulating layer; and
an upper electrode on the ferroelectric layer.

2. The ferroelectric capacitor of claim 1, wherein each of the first and second supporting insulating layers comprises a nitride and an oxide sequentially stacked in this order.

3. The ferroelectric capacitor of claim 2, further comprising an insulating layer between the substrate and the first supporting insulating layer, the insulating layer having a contact hole exposing a portion of the substrate and a portion of the oxidation barrier conductive layer; and
a contact plug in the contact hole to electrically contact the oxidation barrier conductive layer and the active region of the substrate.

4. The ferroelectric capacitor of claim 3, wherein the contact hole comprises an tipper portion remote from the substrate and a lower portion adjacent the substrate, wherein the contact plug is in the lower portion of the contact hole, and the oxidation barrier conductive layer extends into the upper portion of the contact hole.

5. The ferroelectric capacitor of claim 1, wherein the upper electrode extends on adjacent lower electrode of adjacent ferroelectric capacitor and the ferroelectric layer extends on the adjacent lower electrode.

6. The ferroelectric capacitor of claim 5, further comprising a hydrogen diffusion layer on the ferroelectric layer and on the upper electrode.

7. The ferroelectric capacitor of claim 1, further comprising an adhesion conductive layer between sidewall and bottom of the oxidation barrier conductive layer and the first trench.

8. The ferroelectric capacitor of claim 7, further comprising an insulating layer between the substrate and the first supporting insulating layer, the insulating layer having a contact hole exposing a portion of the substrate and a portion of the oxidation baffler conductive layer; and
a contact plug in the contact hole to electrically contact the oxidation barrier conductive layer and the active region of the substrate.

9. The ferroelectric capacitor of claim 8, wherein the contact hole comprises an upper portion remote from the substrate and a lower portion adjacent the substrate, wherein the contact plug is in the lower portion of the contact hole, and the oxidation barrier conductive layer extends into the upper portion of the contact hole.

10. The ferroelectric capacitor of claim 1, further comprising an insulating layer between the substrate and the first supporting insulating layer, the insulating layer having a contact hole exposing a portion of the substrate and a portion of the oxidation barrier conductive layer; and
a contact plug in the contact hole to electrically contact the oxidation barrier conductive layer and the active region of the substrate.

11. The ferroelectric capacitor of claim 10, wherein the contact hole comprises an upper portion remote from the substrate and a lower portion remote from the oxidation barrier conductive layer, wherein the contact plug is in the lower portion of the contact hole, and the oxidation barrier conductive layer extends into the upper portion of the contact hole.

12. The ferroelectric capacitor of claim 10, further comprising a hydrogen diffusion layer on the ferroelectric layer and on the upper electrode.

* * * * *

UNITED STATES PATENT AND TRADEMARK OFFICE
CERTIFICATE OF CORRECTION

| | | |
|---|---|---|
| PATENT NO. | : 7,230,291 B2 | Page 1 of 1 |
| APPLICATION NO. | : 10/650879 | |
| DATED | : June 12, 2007 | |
| INVENTOR(S) | : Kim | |

It is certified that error appears in the above-identified patent and that said Letters Patent is hereby corrected as shown below:

<u>In The Claims:</u>

Column 14, Claim 4, Line 8:  Please correct "tipper"
                                        To read -- upper--

Column 14, Claim 8, Line 29:  Please correct "baffler"
                                        To read -- barrier--

Column 14, Claim 12, Line 55:  Please correct "claim 10"
                                          To read -- claim 1--

Signed and Sealed this

Eleventh Day of September, 2007

JON W. DUDAS
*Director of the United States Patent and Trademark Office*